United States Patent Office 3,846,169
Patented Nov. 5, 1974

3,846,169

METHOD OF TREATING SEMICONDUCTOR MATERIALS CONSISTING OF III–V COMPOUNDS

Daniel Diguet and Loic Henry, Herouville-St.-Clair, France, assignors to U.S. Philips Corporation, New York, N.Y.

No Drawing. Filed Aug. 14, 1972, Ser. No. 280,423
Claims priority, application France, Aug. 18, 1971, 7130095
Int. Cl. C23b 5/62
U.S. Cl. 117—213 6 Claims

ABSTRACT OF THE DISCLOSURE

Method of treating semiconductor materials consisting of III–V-compounds.

Method of treating the surface of wafers of *p*-type semiconductor materials consisting of III–V-compounds. The method is characterized in that the wafers are immersed in a liquid metal bath.

Use: provision of metal layers on the semiconductors. (No Figure).

The present invention relates to a method of treating the surface of a region of a semiconductor wafer in which at least the said region is of *p*-type conductivity and consists of a compound of at least one element from the third column and at least one element from the fifth column of the periodic system of elements, in particular for improving the adherence of metal layers to be deposited after the treatment.

It is known that the adherence of metal deposits on wafers of *p*-type semiconductor material of so-called III–V-compounds frequently is unsatisfactory.

For example, when manufacturing planar devices on gallium arsenide wafers, it is extremely difficult to make contacts to the *p*-type regions.

The provision of these contacts comprises the evaporation of metal, in particular aluminum. The evaporated metal generally adheres poorly to *p*-type gallium arsenide. Hitherto it has generally been necessary to repeat the evaporation operations and to remove the first deposited layers one after the other, for example in a potassium bath, until adherence is obtained. Such a method is expensive and is unsuitable for large-scale manufacture.

The various known etching baths, in particular the mixtures of chromic acid and hydrofluoric acid, and the mixtures of sulphuric acid and hydrogen peroxide provide non-reproducible results and irregular etching.

The method of treating the surface of a region of a semiconductor wafer in which at least the region is of *p*-type conductivity and consists of at least one element from the third column and at least one element from the fifth column of the periodic system of elements, in particular for improving the adherence of metal layers to be deposited after the treatment, according to the invention is characterized in that during a given time the said wafer is immersed in a liquid metal bath and then taken from the bath, residual traces of metals from the bath being subsequently removed from the surface.

The method is preferably performed at a temperature near room temperature, thereby avoiding disturbance of the crystalline state of the wafers and of the diffusions performed.

Preferably gallium is used as the metal; experience has shown, for example, that when a gallium arsenide wafer the surface condition of which has been deteriorated by diffusion treatments, in particular by the diffusion of the impurities which impart *p*-type conductivity to the gallium arsenide, so that the wafer is unsuitable or at least not particularly suitable to serve as a substrate for metallisations, is immersed for a period of from 5 to 30 minutes the surface condition is completely changed.

The operation may be performed in a temperature range between 30° C. and 200° C., preferably between 80° C. and 150° C., for at this temperature the gallium has a higher degree of liquidity than at room temperature, which permits better wetting of the material surface by the metal without disturbing the crystalline state of the gallium arsenide.

Furthermore, it is advantageous to slightly agitate the wafer to promote wetting of the surface of the semiconductor by the metal.

After the wafer has been taken from the bath residual gallium is removed. The wafer may be immersed in a boiling hydrochloric acid bath for from 15 to 30 minutes, preferably for 15 minutes.

Finally the wafers are cleaned, for example in an organic trichloroethylene solvent or in ethyl acetate, to improve their surface condition. It may be of advantage to rub the surface with cotton impregnated with a solvent.

Microscopic inspection of the wafer after this treatment shows that its appearance has been changed, it is no longer polished as it was after the diffusion treatment, it is slightly etched and as it were passivated.

It may be assumed that some of the arsenic from the surface of the plate is dissolved in the bath, however, we do not want to tie the present invention to this explanation.

The treated wafers have a highly satisfactory surface condition which permits the adherence of deposited metal and in particular deposited aluminum on the diffused *p*-type regions.

According to the present invention the treatment may be completed, if required, by depositing a layer of metal, for example a layer of aluminum.

This aluminum layer may serve to anchor a contact and, as the case may be, a connection to the wafer.

Experience has shown that the same results, although less regular, are obtainable by using other liquid metals, in particular mercury.

The following description of an exemplary embodiment will provide a better understanding of the manner in which the present invention may be carried out.

A gallium arsenide wafer having a protective layer of silicon nitride in which openings have been made to expose regions which by doping with zinc have acquired *p*-type conductivity and contain, for example, $10^{20}$ zinc atoms per cubic cm. Contacts are to be made to these *p*-type regions.

The wafer is immersed in a gallium bath having a temperature of 120° C., care being taken to ensure that the wafer is introduced in the bath in such manner as to substantially avoid the formation of a gallium oxide layer at the surface.

The wafer is left in the bath for about 15 minutes whilst being steadily agitated.

The wafer is removed from the bath, again in a manner such as to avoid the formation of a gallium oxide layer, and is immersed in a boiling hydrochloric acid bath in which it is kept for 15 minutes. The residual gallium on the surface of the wafer becomes detached and collects to form droplets which are taken up in the bath.

To finish the surface the wafer is immersed in ethyl acetate and the surface is rubbed with cotton impregnated with this solvent.

Subsequently, an aluminum layer may be deposited on the resulting surface by vacuum evaporation. For this purpose, the wafer is heated to about 150° C.

It should be noted that the gallium bath may be recovered and may be used a large number of times.

What is claimed is:

1. In a method for making ohmic contact to the surface of a *p*-type III–V-compound semiconductor crystal wherein a contact metal is vapor-deposited onto the said surface to form a solid contact, the improvement comprising before vapor depositing the solid contact the said surface is brought into contact with liquid metal selected from the group consisting of gallium and mercury at a relatively lower temperature, next any liquid metal residue present is removed from the said surface, and thereafter the said solid contact metal is deposited on the said surface.

2. The method of claim 1 wherein the compound semiconductor is gallium arsenide, the liquid metal is gallium at a temperature of 80°–150° C., and the time of contact is from 5–30 minutes.

3. The method of claim 2 wherein the gallium residue is removed by boiling hydrochloric acid.

4. In a method for making ohmic contact to a *p*-type diffused surface region of a gallium arsenide semiconductor crystal wherein aluminum contact metal is vapor-deposited onto the said surface to form a solid contact, the improvement comprising before vapor depositing the aluminum the said surface is brought into contact with a liquid metal etching bath at a temperature between 30° and 200° C., said liquid metal being selected from the group consisting of gallium and mercury, next any liquid metal residue present is removed from the said surface by etching, and thereafter the said aluminum contact metal is evaporated on the said surface.

5. The method of claim 4 wherein the liquid metal is gallium.

6. A gallium arsenide crystal having a *p*-type surface contacted by aluminum and made by the process of claim 4.

References Cited

UNITED STATES PATENTS 3,158,504 11/1964 Anderson .......... 117—227 X

MAYER WEINBLATT, Primary Examiner

U.S. Cl. X.R.

117—212, 113, 114, 227; 156—17